(12) United States Patent
Park et al.

(10) Patent No.: US 6,465,293 B2
(45) Date of Patent: Oct. 15, 2002

(54) METHOD OF MANUFACTURING A FLASH MEMORY CELL

(75) Inventors: Soo Young Park, Kyungki-Do (KR); Jung II Cho, Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/882,189

(22) Filed: Jun. 15, 2001

(65) Prior Publication Data

US 2002/0001898 A1 Jan. 3, 2002

(30) Foreign Application Priority Data

Jun. 30, 2000 (KR) .............................. 00-37004

(51) Int. Cl.$^7$ .......................................... H01L 21/8238
(52) U.S. Cl. ...................................... 438/214; 438/266
(58) Field of Search .................................. 438/214, 266

(56) References Cited

U.S. PATENT DOCUMENTS 6,312,991 B1 * 3/2000 Wang et al. ................ 438/266

* cited by examiner

*Primary Examiner*—David Nelms
*Assistant Examiner*—Reneé R Berry
(74) *Attorney, Agent, or Firm*—Marshall, Gerstein & Borun.

(57) ABSTRACT

A method of manufacturing a flash memory cell is disclosed. The method comprises the steps of forming an oxide film on a semiconductor substrate in which a device separation film is formed and then patterning the oxide film to expose the semiconductor substrate at a portion in which a floating gate will be formed; sequentially forming a tunnel oxide film and a first polysilicon layer on the entire structure, and then flattening the first polysilicon layer until the tunnel oxide film is exposed to form a floating gate; etching the tunnel oxide film and the oxide film in the exposed portion to a given thickness and the forming a dielectric film on the entire structure; sequentially forming a second polysilicon layer, a tungsten silicide layer and a hard mask and then patterning them to form a control gate; and injecting impurity ions into the semiconductor substrate at the both sides of the floating gate to form a junction region.

7 Claims, 3 Drawing Sheets

METHOD OF MANUFACTURING A FLASH MEMORY CELL

BACKGROUND OF THE INVENTION

1. Field of the Invention

The invention relates generally to a method of manufacturing a flash memory cell, and more particularly to a method of manufacturing a flash memory cell capable of preventing a poor coverage due to undulations in the structure caused by the floating gates.

2. Description of the Prior Art

In general, a flash memory cell includes a floating gate and a control gate both of which are stacked on a channel region of a semiconductor substrate, and a junction region formed in the semiconductor substrate at both sides of the floating gate, which is constructed to be programmed as hot electrons are injected into the floating gate, or to be erased as the injected electrons are discharged, depending on a bias voltage condition applied to the control and the junction region.

A method of manufacturing a conventional flash memory cell constructed as above will be below explained by reference to FIG. 1.

A tunnel oxide film 3 and a polysilicon layer 4 are sequentially formed on a semiconductor substrate 1 in which a device separation film 2 is formed and are then patterned to form a floating gate 4. After a dielectric film 5 consisting of an oxide film, a nitride film and an oxide film is formed on the entire structure, a polysilicon layer 6 is formed on the dielectric film 5. Then, a tungsten silicide layer 7 is formed on the polysilicon layer 6. Next, the tungsten silicide layer 7, the polysilicon layer 6 and the dielectric film 5 are sequentially patterned to form a control gate consisted of the polysilicon layer 6 and the tungsten silicide layer 7. Thereafter, impurity ions are injected into the semiconductor substrate 1 at both sides of the exposed floating gates 4 to form a junction region (not shown).

If the above-mentioned conventional method is used, the coverage of the dielectric film 5, the polysilicon layer 6 and the tungsten silicide layer 7 becomes poor due to the floating gates shown at 4.

This poor coverage becomes severe as the distance between the neighboring floating gates 4 is reduced by reduction in the size of the memory cell. At its worst case, voids 8 are generated as the polysilicon layer 6 and the tungsten silicide layer 7 are deposited, thus increasing the self-resistance (Rs) of the floating gate.

In order to prevent generation of the voids 8, it is required that the thickness of the polysilicon layer constituting the floating gates 4 be thinner and the distance between the floating gates 4 must be increased. Reduction in the thickness of the floating gates 4, however, causes a change in the capacitance of the memory cell. Also, it is difficult to reduce the distance between the floating gates 4 since it is affected by a design rule and a lithography process. Therefore, there is a need for a new process development.

SUMMARY OF THE DISCLOSURE

A method of manufacturing a flash memory cell capable of solving the aforenoted problem is disclosed whereby a floating gate is formed between oxide film patterns using a damascene pattern and then the thickness of the oxide film patterns is reduced, so that the thickness undulations in the structure of the cell caused by the of the floating gates can be reduced.

A method of manufacturing a flash memory cell comprises the steps of forming an oxide film on a semiconductor substrate in which a device separation film is formed and then patterning the oxide film to expose the semiconductor substrate at a portion in which a floating gate will be formed; sequentially forming a tunnel oxide film and a first polysilicon layer on the entire structure, and then flattening the first polysilicon layer until the tunnel oxide film is exposed to form a floating gate; etching the tunnel oxide film and the oxide film in the exposed portion to a given thickness and the forming a dielectric film on the entire structure; sequentially forming a second polysilicon layer, a tungsten silicide layer and a hard mask and then patterning them to form a control gate; and injecting impurity ions into the semiconductor substrate at the both sides of the floating gate to form a junction region.

The oxide film is one of a high temperature oxide film or a high-density plasma oxide film. The flattening process is performed by chemical mechanical polishing process or by spin wet etching process using rotation. The tunnel oxide film and the oxide film in the exposed portion are etched more than 20% of the thickness of the floating gate.

BRIEF DESCRIPTION OF THE DRAWINGS

The aforementioned aspects and other features of the disclosed method will be explained in the following description, wherein.

DETAILED DESCRIPTION OF PRESENTLY PREFERRED EMBODIMENTS

The disclosed method will be described in detail by way of a preferred embodiment with reference to accompanying drawings.

Figure 1:
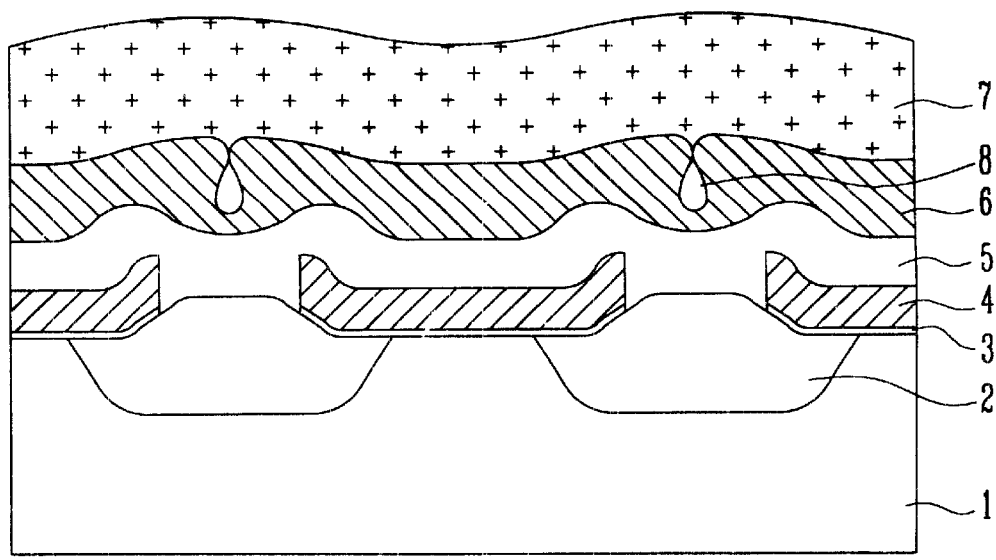
FIG. 1 is a cross-sectional view of a device for explaining a method of manufacturing a conventional flash memory cell.
Figure 2A:
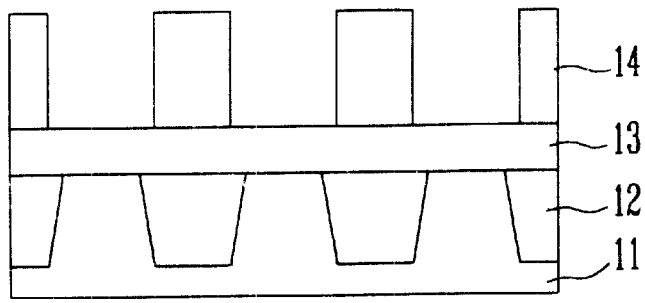
FIGS. 2A through 2G are cross-sectional views of a device for explaining a disclosed method of manufacturing a flash memory cell.

FIGS. 2A through 2G are cross-sectional views of a device for explaining a disclosed method of manufacturing a flash memory cell. Referring now to FIG. 2A, after an oxide film 13 is formed on a semiconductor substrate 11 in which a device separation film 12 is formed, a photosensitive film 14 is formed so that the oxide film 13 at the portion in which a floating gate will be formed can be exposed. The oxide film 13 is formed by high temperature oxidization (HTO) or high-density plasma (HDP) oxide, wherein a nitride film or a silicon nitride (SiON) may be used instead of the oxide film 13. At this time, the oxide film 13 is formed with a thickness ranging from about 500Å to about 2000Å.

Figure 2B:
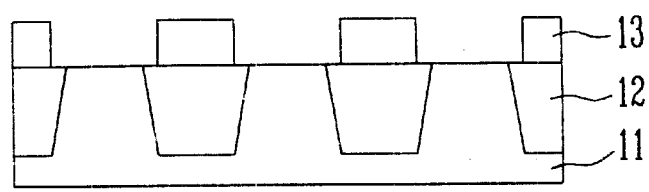

Referring now to FIG. 2B, the exposed portion of the oxide film 13 is etched using the photosensitive film pattern 14 as a mask. The etching process is performed by means of dry etch method using an etch gas having an etch select ratio of 2:1 or more with the semiconductor substrate 11, for example, a gas in which fluorine is mixed with $O_2$ at a temperature ranging from about −30° C. to about 0° C., wherein the mixture ration of the gas is controlled so that an over-etch of more than 50% can be obtained.

Figure 2C:
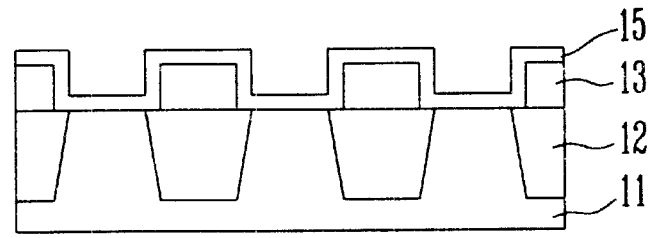
Figure 2D:
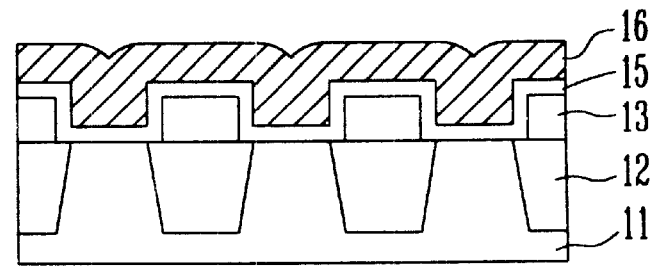

FIG. 2C is a cross-sectional view of the device in which a tunnel oxide film 15 is formed on the entire structure. FIG. 2D is a cross-sectional view of the device in which a first polysilicon layer 16 is formed on the tunnel oxide film 15.

Figure 2E:
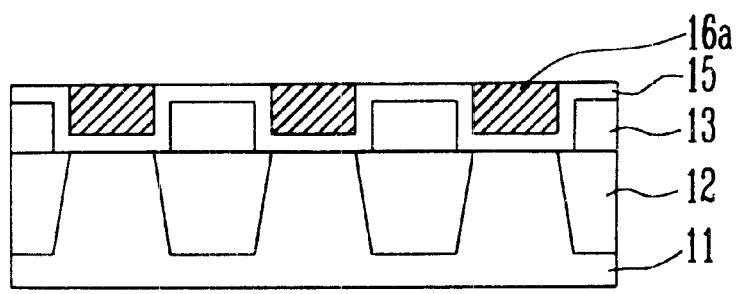

FIG. 2E is a cross-sectional view of the device in which the first polysilicon layer 16 is flattened until the tunnel oxide film 15 is exposed, thus forming a floating gate 16a. The flattening process is performed by chemical mechanical polishing process or by spin wet etching process using rotation. After the flattening process, an etching back process having a low etch rate is additionally performed.

Figure 2F:
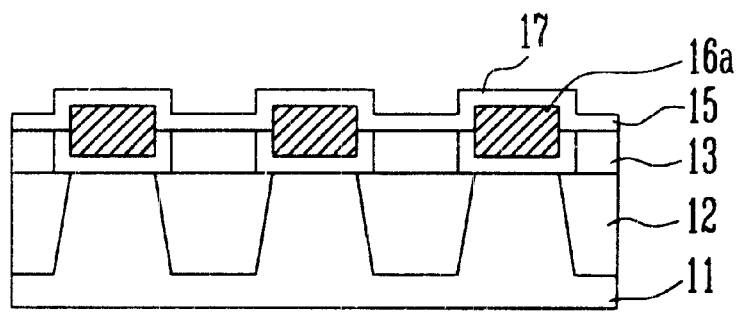

FIG. 2F is a cross-sectional view of the device in which the exposed portion of the tunnel oxide film 15 and the oxide film 13 are etched to a given thickness and the dielectric film 17 is then formed. At this time, the tunnel oxide film 15 and the oxide film 13 is removed more than about 20% of the thickness of the floating gate 16a, and the dielectric film 17 is formed in a ONO structure in which an oxide film, a nitride film and an oxide film are stacked.

Figure 2G:
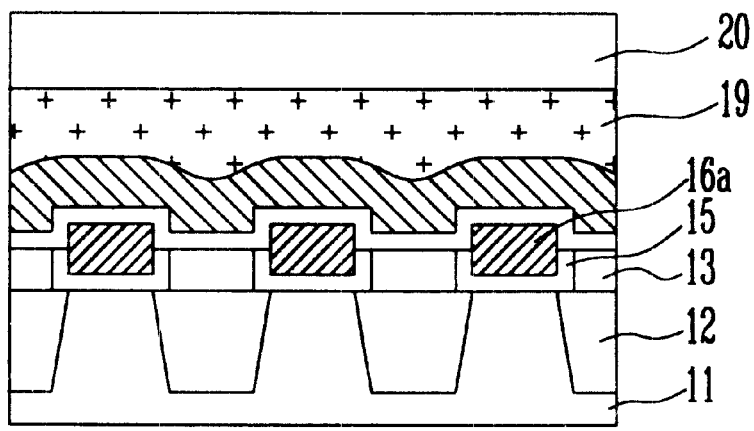

FIG. 2G is a cross-sectional view of the device in which a second polysilicon layer 18, a tungsten silicide layer 19 and a hard mask 20 are sequentially formed on the dielectric film 17.

Thereafter, the hard mask 20, the tungsten silicide layer 19 and the second polysilicon layer 18 are sequentially patterned to form a control gate which comprises the second polysilicon layer 18 and the tungsten silicide layer 19 Then, impurity ions are injected into the exposed semiconductor substrate 11 in the both sides of the floating gate 16a, thus forming a junction region (not shown).

As mentioned above, the disclosed method forms a floating gate between oxide film patterns using a damascene pattern, reduces the thickness of the oxide film patterns so that the effective thickness of the undulations in the structure caused by the floating gates can be reduced, and sequentially forms a dielectric film, a polysilicon layer and a tungsten silicide layer. Therefore, as the thickness of the undulations in the structure caused by the floating gates is reduced, the coverage of the dielectric film, the polysilicon layer and the tungsten silicide layer becomes improved.

Therefore, the disclosed method can prevent creation of voids and thus can prevent increase in the self-resistance. Thus, it can improve an electric characteristic. Also, the disclosed method facilitates a subsequent process and also stabilizes the process since the step of the entire surface is reduced, thus improving the throughput of the device.

The disclosed method has been described with reference to a particular embodiment in connection with a particular application. Those having ordinary skill in the art and access to the teachings of the disclosed method will recognize additional modifications and applications within the scope thereof.

It is therefore intended by the appended claims to cover any and all such applications, modifications, and embodiments within the scope of the disclosed method.

What is claimed:

1. A method of manufacturing a flash memory cell, comprising the steps of:

providing a substrate with a device separation film formed therein;

forming an oxide film on the device separation film and the substrate;

patterning said oxide film to expose said semiconductor substrate at portions defined by said device separation film and where a floating gate will be formed;

sequentially forming a tunnel oxide film and a first polysilicon layer on the entire structure;

flattening said first polysilicon layer until a portion of said tunnel oxide film is exposed to form a floating gate;

etching said tunnel oxide film and said oxide film in the exposed portion to a given thickness and the forming a dielectric film on the entire structure;

sequentially forming a second polysilicon layer, a tungsten silicide layer and a hard mask and then patterning them to form a control gate; and injecting impurity ions into the semiconductor substrate at the both sides of the floating gate to form a junction region.

2. The method of manufacturing a flash memory cell according to claim 1, wherein said oxide film is one of a high temperature oxide film or a high density plasma oxide film.

3. The method of manufacturing a flash memory cell according to claim 1, wherein said oxide film is formed with a thickness ranging from about 500Å to about 200Å.

4. The method of manufacturing a flash memory cell according to claim 1, wherein said oxide film is etched by dry etching method using a gas in which fluorine is mixed with $O_2$ at a temperature ranging from about −30° C. to about 0° C.

5. The method of manufacturing a flash memory cell according to claim 1, wherein said flattening process is performed by chemical mechanical polishing process or by spin wet etching process using rotation.

6. The method of manufacturing a flash memory cell according to claim 1, further including performing an etching back process after said flattening process.

7. The method of manufacturing a flash memory cell according to claim 1, wherein said tunnel oxide film and said oxide film in the exposed portion are etched more than about 20% of a thickness of the said floating gate.

* * * * *